(12) United States Patent
Inaba

(10) Patent No.: US 12,036,573 B2
(45) Date of Patent: Jul. 16, 2024

(54) COATING FILM FORMING METHOD AND COATING FILM FORMING APPARATUS

(71) Applicant: Tokyo Electron Limited, Tokyo (JP)

(72) Inventor: Shougo Inaba, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 372 days.

(21) Appl. No.: 17/274,560

(22) PCT Filed: Aug. 28, 2019

(86) PCT No.: PCT/JP2019/033719
§ 371 (c)(1),
(2) Date: Mar. 9, 2021

(87) PCT Pub. No.: WO2020/054424
PCT Pub. Date: Mar. 19, 2020

(65) Prior Publication Data
US 2022/0055063 A1    Feb. 24, 2022

(30) Foreign Application Priority Data

Sep. 10, 2018   (JP) .................................. 2018-168965

(51) Int. Cl.
*B05C 11/08*     (2006.01)
*B05C 11/02*     (2006.01)
(Continued)

(52) U.S. Cl.
CPC ............ *B05C 11/08* (2013.01); *B05C 11/023* (2013.01); *B05D 1/002* (2013.01); *B05D 3/042* (2013.01); *H01L 21/6715* (2013.01)

(58) Field of Classification Search
None
See application file for complete search history.

(56) References Cited

U.S. PATENT DOCUMENTS

| | | | |
|---|---|---|---|
| 5,095,848 A  * | 3/1992 | Ikeno | ................ H01L 21/67023 |
| | | | 118/54 |
| 5,962,193 A | 10/1999 | Lin et al. | |
| 2015/0155197 A1* | 6/2015 | Tachibana | ............... G03F 7/162 |
| | | | 438/782 |

FOREIGN PATENT DOCUMENTS

| | | | |
|---|---|---|---|
| JP | H05-283331 A | 10/1993 | |
| JP | 2005-235950 A | 9/2005 | |

(Continued)

OTHER PUBLICATIONS

International Search Report for PCT/JP2019/033719 dated Nov. 19, 2019.

*Primary Examiner* — Alexander M Weddle
(74) *Attorney, Agent, or Firm* — Pearne & Gordon LLP

(57) ABSTRACT

A coating film forming method includes holding a substrate by a substrate holder; forming an air flow on a front surface of the substrate; supplying a coating liquid configured to form a coating film on the front surface; forming, after moving a covering member from a first position to a second position relatively to the substrate, the air flow in a gap formed by the covering member placed at the second position and the front surface of the substrate being rotated at a first rotation number such that a flow velocity of the air flow becomes larger than that of the air flow obtained when the covering member is placed at the first position; and rotating the substrate at a second rotation number higher than the first rotation number to adjust a film thickness distribution of the coating film by scattering the coating liquid from a peripheral portion thereof.

12 Claims, 9 Drawing Sheets

(51) Int. Cl.
*B05D 1/00* (2006.01)
*B05D 3/04* (2006.01)
*H01L 21/67* (2006.01)

(56) References Cited

FOREIGN PATENT DOCUMENTS

| | | | |
|---|---|---|---|
| JP | 2012-238838 A | | 12/2012 |
| JP | 2015-009180 A | | 1/2015 |
| JP | 2015-109306 A | | 6/2015 |
| JP | 2015-216168 A | | 12/2015 |
| JP | 2015216168 A | * | 12/2015 |
| JP | 2017-092392 A | | 5/2017 |
| JP | 2017-107919 A | | 6/2017 |
| KR | 10-2017-0057136 A | | 5/2017 |

* cited by examiner

COATING FILM FORMING METHOD AND COATING FILM FORMING APPARATUS

CROSS-REFERENCE TO RELATED APPLICATION

This Application is a U.S. national phase application under 35 U.S.C. § 371 of PCT Application No. PCT/JP2019/033719 filed on Aug. 28, 2019, which claims the benefit of Japanese Patent Application No. 2018-168965 filed on Sep. 10, 2018, the entire disclosures of which are incorporated herein by reference.

TECHNICAL FIELD

The various aspects and embodiments described herein pertain generally to a coating film forming method and a coating film forming apparatus.

BACKGROUND

In a manufacturing process for a semiconductor device, a film forming processing is performed by coating various kinds of coating liquids such as a resist on a semiconductor wafer (hereinafter, simply referred to as "wafer") as a substrate having a circular shape. Patent Document 1 describes a method of rectifying an air flow on the wafer by placing an annular member, which is provided along a circumference of the wafer, when drying the resist coated on the wafer.

Patent Document 1: Japanese Patent Laid-open Publication No. 2017-092392

SUMMARY

In an exemplary embodiment, a coating film forming method includes holding a substrate by a substrate holder; forming an air flow on a front surface of the substrate by exhausting an atmosphere around the substrate; supplying a coating liquid configured to form a coating film on the front surface of the substrate; forming, after moving a covering member configured to cover the substrate from a first position to a second position relatively to the substrate on which the coating liquid is supplied, the air flow in a gap formed by the covering member placed at the second position and the front surface of the substrate such that a flow velocity of the air flow becomes larger than a flow velocity of the air flow obtained when the covering member is placed at the first position; and rotating the substrate at a second rotation number higher than a first rotation number of the substrate in the forming of the air flow in the gap to adjust a film thickness distribution of the coating film by scattering the coating liquid from a peripheral portion of the substrate.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
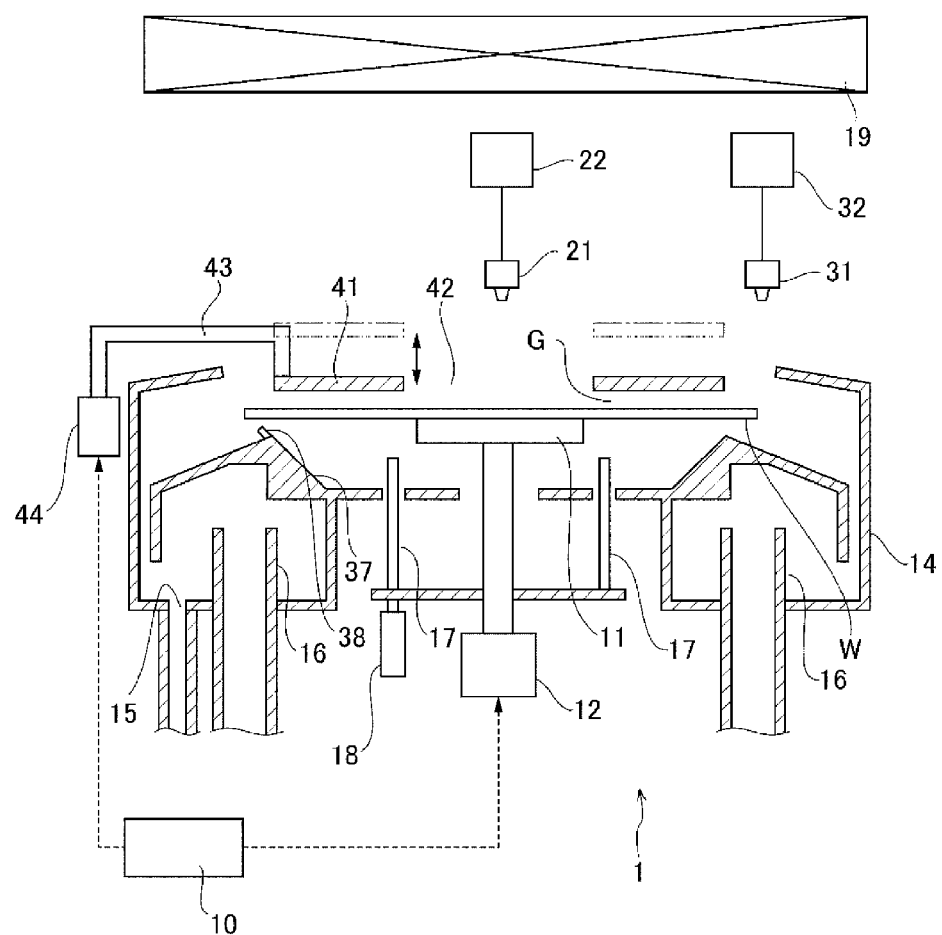
FIG. 1 is a longitudinal side view of a resist coating apparatus according to an exemplary embodiment of the present disclosure.

A resist film forming apparatus 1 as an exemplary embodiment of a coating film forming apparatus according to the present disclosure will be described with reference to a longitudinal side view of FIG. 1 and a plan view of FIG. 2. The resist film forming apparatus 1 is equipped with a spin chuck 11 as a substrate holder configured to hold a wafer W as a circular substrate having a diameter of, e.g., 300 mm horizontally by vacuum-attracting a central portion of a rear surface of the wafer W. This spin chuck 11 is connected to a rotating device 12, and rotated around a vertical axis by the rotating device 12. Further, a cup 14 is disposed to surround the wafer W held by the spin chuck 11 to suppress scattering of various kinds of chemical liquids from the wafer W. A liquid drain port 15 is opened at a bottom of the cup 14. Further, an exhaust line 16 is provided at the bottom of the cup 14, and the inside of the cup 14 is evacuated during a processing upon the wafer W. Through the evacuation of the inside of the cup 14, an atmosphere on a front surface of the wafer W is exhausted from around the wafer W.

A reference numeral 17 denotes three elevating pins disposed around the spin chuck 11. The elevating pins 17 are vertically moved up and down by an elevating device 18 to deliver the wafer W between the spin chuck 11 and a non-illustrated substrate transfer device. A fan filter unit (FFU) 19 is disposed above the cup 14 and is configured to supply clean air to the wafer W placed on the spin chuck 11. The air supplied to the wafer W is exhausted through the exhaust line 16. Further, a rear surface cleaning nozzle 38 is provided at a supporting member 37 which is disposed near the spin chuck 11. The rear surface cleaning nozzle 38 is configured to discharge a solvent of a resist onto a peripheral portion of the rear surface of the wafer W to clean it.

The resist film forming apparatus 1 is equipped with a resist supply nozzle 21 configured to discharge the resist vertically downwards, for example. This resist supply nozzle 21 is connected to a resist supply device 22 which stores the resist therein. The resist supply device 22 includes a pump, a valve, and so forth, and supplies the resist to the resist supply nozzle 21. Viscosity of the resist stored in the resist supply device 22 is in a range from, e.g., 50 cp to 1000 cp. The resist supply nozzle 21 is supported at a leading end of an arm 23, and a base end of the arm 23 is connected to a moving device 24. The resist supply nozzle 21 is configured to be moved in a horizontal direction and a vertical direction by the moving device 24 via the arm 23. A reference numeral 25 in FIG. 2 denotes a guide configured to move the arm 23 horizontally, and a reference numeral 26 in FIG. 2 indicates a standby region where the resist supply nozzle 21 stands by at an outside of the cup 14.

Further, the resist film forming apparatus 1 is equipped with a solvent supply nozzle 31 configured to discharge the solvent vertically downwards, for example. The solvent supply nozzle 31 is connected to a solvent supply device 32 which stores the solvent therein, and the solvent is supplied from this solvent supply device 32 to the solvent supply nozzle 31. The solvent supply nozzle 31 is used to remove an unnecessary resist film on a peripheral portion of the wafer W. The solvent supply nozzle 31 is supported at a leading end of an arm 33, and a base end of the arm 33 is connected to a moving device 34. The solvent supply nozzle 31 is configured to be moved in the horizontal direction and the vertical direction by the moving device 34 via the arm 33. A reference numeral 35 in FIG. 2 denotes a guide configured to move the arm 33 horizontally, and a reference numeral 36 in FIG. 2 indicates a standby region where the solvent supply nozzle 31 stands by at an outside of the cup 14.

Furthermore, the resist film forming apparatus 1 is also equipped with a ring plate 41 as a circular ring-shaped member, which is located above the wafer W placed on the spin chuck 11. A circular opening 42 is formed at a central portion of the ring plate 41. A bottom surface of the ring plate 41 faces and covers the wafer W placed on the spin chuck 11. When viewed from the top, a center of the ring plate 41, that is, a center of the opening 42 is aligned with a center of the wafer W placed on the spin chuck 11. Thus, the ring plate 41 is formed along a circumference of the wafer W.

Figure 2:
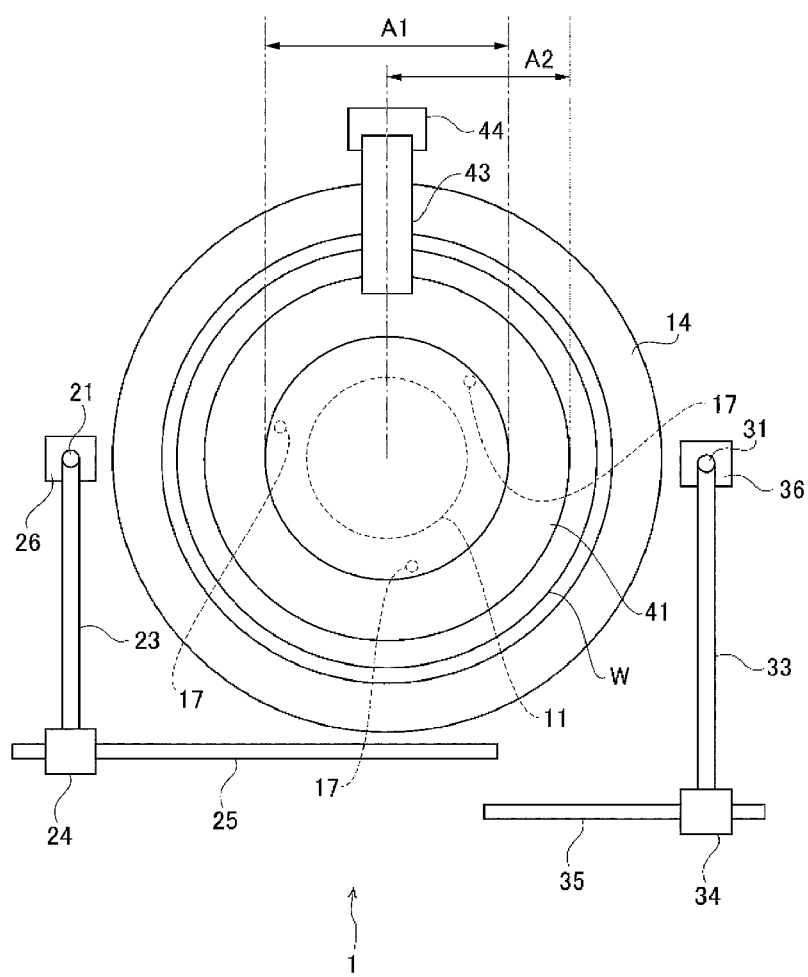
FIG. 2 is a plan view of the resist coating apparatus.

A diameter A1 of the opening 42 shown in FIG. 2 is in a range from, e.g., 30 mm to 80 mm. A length A2 from the center of the opening 42 to a circumference edge of the ring plate 41 is in a range from, e.g., 120 mm to 145 mm. Thus, a central portion and a peripheral portion of the wafer W is not covered by the ring plate 41. For the convenience of explanation, a portion of the wafer W covered by the ring plate 41 serving as a covering member will sometimes be referred to as a middle portion. The ring plate 41 is connected to an elevating device 44 via a supporting member 43, and is moved up and down between a raised position (first position) indicated by a dashed dotted line in FIG. 1 and a lowered position (second position) under the raised position. The lowered position is indicated by a solid line in FIG. 1.

The resist film forming apparatus 1 is equipped with a controller 10 which is implemented by a computer. A program stored in a recording medium such as a compact disk, a hard disk, a MO (magneto-optical disc), a memory card or a DVD is installed to the controller 10. The installed program includes commands (steps) created to send control signals to the individual components of the resist film forming apparatus 1 and control operations thereof. To elaborate, operations such as changing of a rotation number of the wafer W by the rotating device 12, moving of the resist supply nozzle 21 and the solvent supply nozzle 31, supplying and stopping the supply of the resist from the resist supply device 22 to the resist supply nozzle 21, and elevating of the ring plate 41 are controlled by the program.

Figure 3:
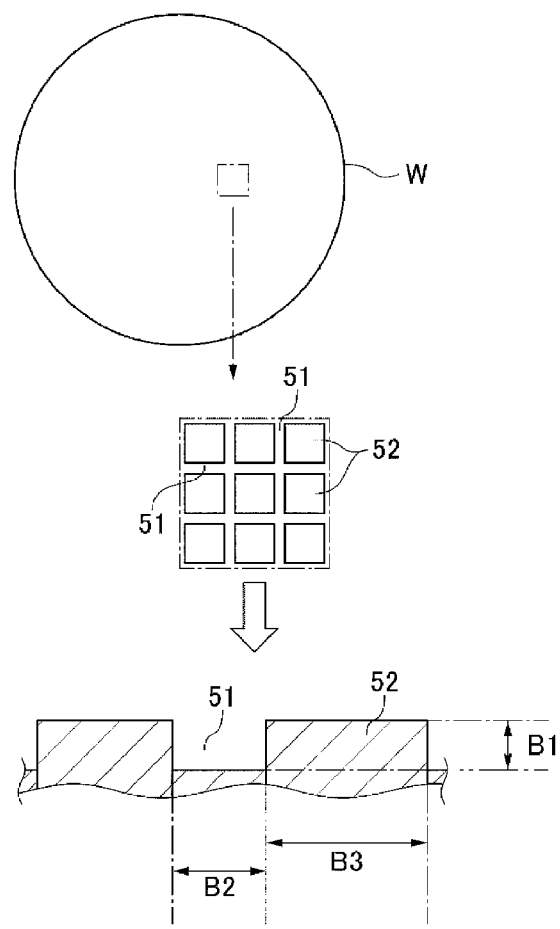
FIG. 3 is an explanatory diagram illustrating an example of a wafer processed in the resist coating apparatus.

Now, the wafer W processed by this resist film forming apparatus 1 will be described with reference to FIG. 3. An irregularity pattern is formed on the front surface of the wafer W. A region on the front surface of the wafer W surrounded by a dashed dotted line shown in FIG. 3 is enlarged at an end of a dashed-dotted-lined arrow of FIG. 3, and an example of the irregularity pattern is illustrated in this enlarged view. In this example, multiple grooves (recesses) 51 are formed in a longitudinal direction and a transversal direction to divide the front surface of the wafer W in a matrix shape. Protrusions surrounded by the grooves 51 are marked by a reference numeral 52, and each protrusion 52 has, for example, a square shape when viewed from the top. A longitudinal side view of the wafer W is illustrated at an end of a white arrow in FIG. 3. A depth B1 of the groove 51 (a height of the protrusion 52) is in a range from, e.g., 1 µm to 15 µm, and, more specifically, e.g., 8 µm. A width B2 of the groove 51 is in a range from, e.g., 10 µm to 5000 µm, and, more specifically, e.g., 200 µm. A width B3 of one side of the protrusion 52 is in a range from, e.g., 10 µm to 5000 µm, and, more specifically, e.g., 2800 µm. Further, a shape of the irregularity pattern is not limited to the example shown in FIG. 3, and the technique of the present disclosure can also be applied to a case where a substrate having no irregularity pattern is processed.

Now, an outline of a processing performed in this resist film forming apparatus 1 will be explained. The resist film forming apparatus 1 coats the resist on the wafer W having the irregularity pattern as stated above by spin coating, and forms a resist film by drying the resist through rotation of the wafer W. If, however, the resist is dried by rotating the wafer W at a relatively high rotation number, film thicknesses of the resist film within the recesses forming the irregularity pattern are not uniform when the wafer W is viewed from a diametrical direction thereof: a film thickness of the resist film at the central portion of the wafer W is larger than a film thickness of the resist film at the peripheral portion thereof. That is, within the surface of the wafer W, uniformity of the film thickness of the resist film within the recesses may be relatively low.

This lack of the uniformity of the film thickness of the resist film is caused because there is generated a relatively large difference between a centrifugal force acting on the central portion of the wafer W and a centrifugal force acting on the peripheral portion thereof if the rotation number of the wafer W is relatively high, and, also, because the viscosity of the resist is relatively high. Furthermore, the presence of the irregularity pattern also causes this lack of the uniformity of the film thickness of the resist film. To elaborate, since the viscosity of the resist is relatively high, fluidity of the resist is relatively largely affected by the centrifugal force. That is, while the resist easily moves outwards at the peripheral portion of the wafer W, it is relatively difficult for the resist to move outwards at the central portion of the wafer W. That is, the resist may easily stay at the central portion of the wafer W, whereas it is difficult for the resist to stay at peripheral portion. Further, since the irregularity pattern is formed, the resist needs to flow over this irregularity pattern to move toward an outer side of the wafer W. Therefore, the resist may be easily left at the peripheral portion where the centrifugal force is small, and, resultantly, the film thickness of the resist becomes non-uniform in the diametrical direction, as stated above. To solve this problem, in the resist film forming apparatus 1, the resist is coated on the entire front surface of the wafer W, and, then, the resist on the front surface of the wafer W is dried by rotating the wafer W at a relatively small rotation number.

Figure 4:
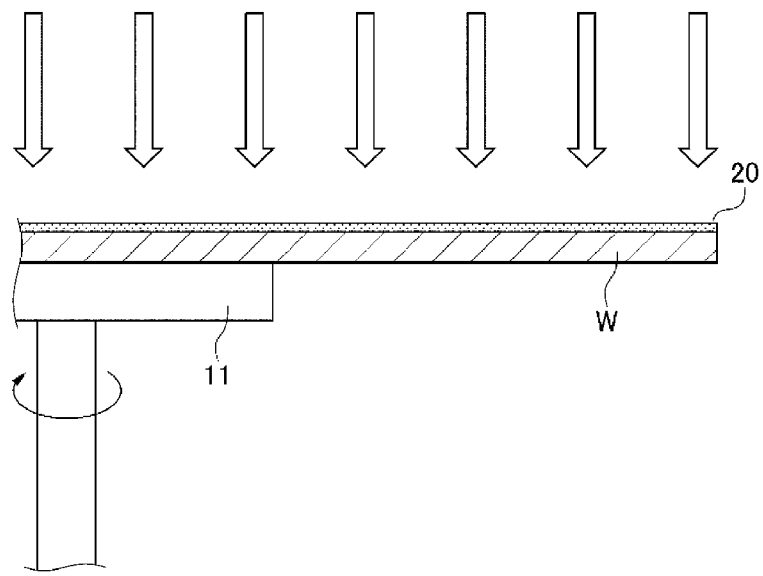
FIG. 4 is an explanatory diagram for describing an air flow around the wafer.
Figure 5:
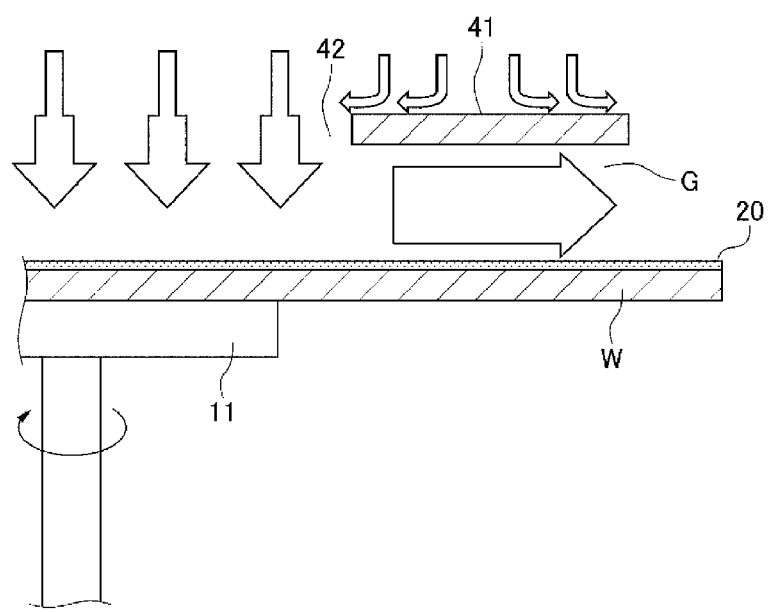
FIG. 5 is an explanatory diagram for describing an air flow around the wafer.

Here, however, if the wafer W is rotated at such a relatively small rotation number, a flow velocity of an air flow on the front surface of the wafer W is small. Accordingly, a drying speed of the resist decreases, resulting in reduction of a throughput. In view of this, in the resist film forming apparatus 1, the ring plate 41 is placed at the aforementioned lowered position when drying the resist by rotating the wafer W at the aforementioned relatively small rotation number. FIG. 4 and FIG. 5 are schematic diagrams illustrating the air flow created when the ring plate 41 is placed at the raised position and the lowered position, respectively. Referring to FIG. 4 and FIG. 5, a reason for this placement of the ring plate 41 will be explained. In FIG. 4 and FIG. 5, white arrows indicate the air flow. A reference numeral 20 denotes the resist.

When the ring plate 41 is located at the raised position, a gap between the front surface of the wafer W and the ring plate 41 is relatively large. Accordingly, the air supplied from the FFU 19 reaches a space under the ring plate 41, and then, is supplied downwards onto the wafer W in a relatively uniform manner. The air supplied onto the wafer W in this way is then flown to an outside of the wafer W to be exhausted.

Meanwhile, when the ring plate 41 is located at the lowered position, a gap G having a relatively small height is formed between the front surface of the wafer W and the bottom surface of the ring plate 41. In this state, a part of the air supplied from the FFU 19 is blocked by the ring plate 41 and introduced into the opening 42 of the ring plate 41 toward the central portion of the wafer W. Then, this air is joined with the air directly supplied toward the central portion of the wafer W from the FFU 19.

Accordingly, as compared to the state where the ring plate 41 is located at the raised position, a flow rate of the air supplied to the central portion of the wafer W is increased, which results in an increase of a velocity of the air flow at the central portion of the wafer W. Further, the air gathered at the central portion of the wafer W flows outwards on the middle portion of the wafer W as the inside of the cup 14 is evacuated. Since the gap G having the relatively small height is formed between the ring plate 41 and the wafer W at this middle portion, that is, since a flow passage is narrow, the air passing a space above the middle portion flows at a higher velocity than the air flowing therein when the ring plate 41 is located at the raised position. Accordingly, since the resist at the central portion and the middle portion of the wafer W is dried relatively quickly as it is exposed to the air flow having the relatively high velocity.

When the wafer W is rotated at the relatively small rotation number to dry the resist as described above, a centrifugal force acting on a circumference edge portion of the wafer W is relatively low, and a surface tension of the resist is high as the viscosity of the resist is relatively high as stated above. Accordingly, while the wafer W is being rotated at the relatively small rotation number as stated above, the resist is difficult to scatter off the circumference edge portion of the wafer W. Meanwhile, since the resist is supplied from the central portion of the wafer W toward the peripheral portion thereof due to the centrifugal force, a relatively large amount of the resist is gathered at the peripheral portion of the wafer W. As a result, there is a concern that the film thickness at the peripheral portion of the wafer W may be become larger than the film thicknesses at the central portion and the middle portion of the wafer W. To suppress this increase of the film thickness at the peripheral portion, the ring plate 41 is configured not to cover the peripheral portion of the wafer W, that is, such that a space above the peripheral portion of the wafer W is opened when viewed from the wafer W.

To elaborate, the smaller the height of the space above the front surface of the wafer W is, that is, the narrower the flow passage is, the higher the velocity of the air flow flowing on the front surface of the wafer W from the central portion toward the peripheral portion thereof may be. Accordingly, the velocity of the air flow at the peripheral portion of the wafer W is lower than the velocity of the air flow at the middle portion of the wafer W. Accordingly, it is difficult for the resist to be dried at the peripheral portion of the wafer W. Thus, by raising the rotation number of the wafer W in the state that the resist of the peripheral portion of the wafer W is not dried, the resist of the peripheral portion of the wafer W is scattered off to be removed from the wafer W. Accordingly, the increase of the film thickness at the peripheral portion of the wafer W is suppressed, and a film thickness distribution is controlled such that the film thickness of the resist has high uniformity within the entire surface of the wafer W. When increasing the rotation number of the wafer W as described above, the air flow on the wafer W is disturbed if the ring plate 41 is placed at the lowered position. In such a case, there is a concern that the uniformity of the film thickness distribution may not be sufficiently improved. Thus, the ring plate 41 is moved to the raised position. Accordingly, when scattering the resist, the gap between the ring plate 41 and the wafer W is larger than the gap therebetween when the wafer W is rotated at the relatively small rotation number to dry the resist.

Further, in Patent Document 1, a ring plate is placed adjacent to a wafer W to suppress generation of a turbulence on a front surface of the wafer W when the wafer W is rotated at a relatively high rotation number of 1800 rpm. However, Patent Document 1 does not mention anything about how to place the ring plate to accelerate drying of a resist when the wafer W is rotated at a relatively small rotation number as in the resist film forming apparatus 1 according to the present exemplary embodiment.

Figure 6:
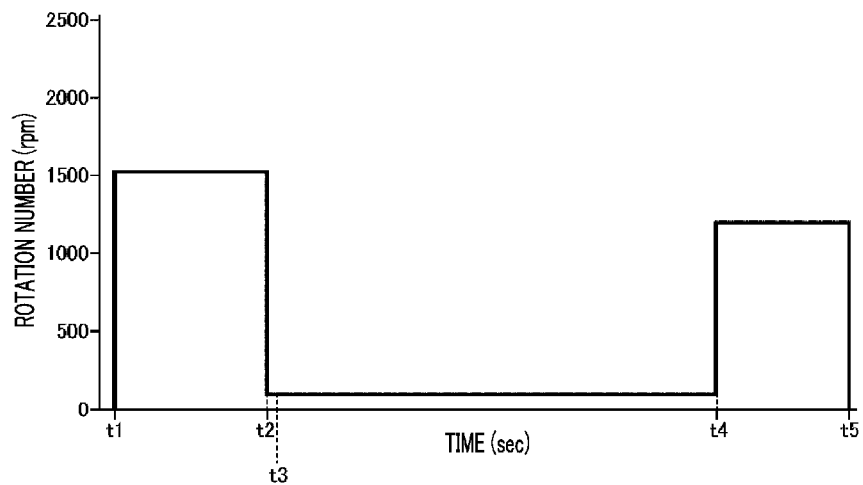
FIG. 6 is a time chart illustrating an example of a variation of a rotation number of the wafer.
Figure 7:
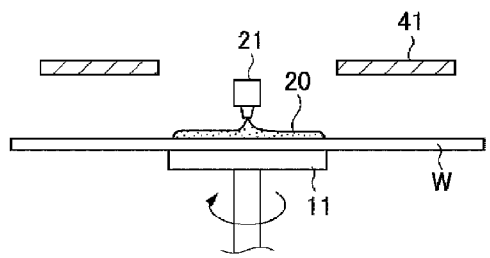
FIG. 7 is a process diagram illustrating a coating processing upon the wafer.

An operation of the above-described resist film forming apparatus 1 will be explained with reference to a time chart of FIG. 6 and process diagrams of FIG. 7 to FIG. 11. On the time chart, a vertical axis represents a rotation number (unit: rpm) of the wafer W. First, the air is supplied from the FFU 19 and the inside of the cup 14 is evacuated. Further, the wafer W is placed on the spin chuck 11 in the state that the ring plate 41 is placed at the raised position, and the central portion of the rear surface of the wafer W is attracted to and held on the spin chuck 11. Then, the resist supply nozzle 21 is placed above the wafer W, and the resist 20 is supplied onto the central portion of the wafer W. The wafer W is rotated at, e.g., 1500 rpm (time t1), and the resist 20 is diffused toward the peripheral portion of the wafer W (see FIG. 7).

Figure 8:
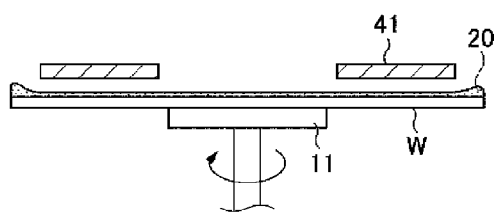
FIG. 8 is a process diagram illustrating the coating processing upon the wafer.
Figure 9:
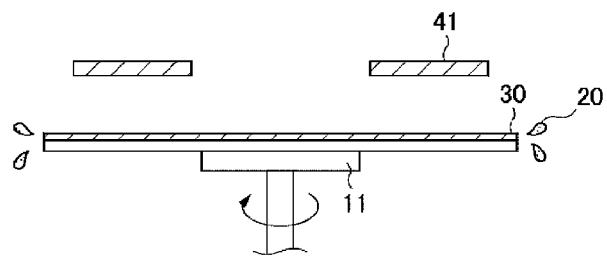
FIG. 9 is a process diagram illustrating the coating processing upon the wafer.

If the resist 20 is diffused on the entire front surface of the wafer W, the rotation number of the wafer W is reduced to, e.g., 200 rpm (time t2), and, then, the ring plate 41 is placed at the lowered position (time t3, FIG. 8). As stated above, since the flow velocity of the air flow on the front surface increases at the central portion and the middle portion of the wafer W, the drying of the resist 20 is carried out rapidly. Then, the ring plate 41 is moved to the raised position, and the rotation number of the wafer W is raised to, e.g., 1200 rpm (time t4). As a result, the resist 20 on the peripheral portion of the wafer W yet to be dried is scattered off, and a resist film 30 is formed of the resist 20 left on the front surface of the wafer W (see FIG. 9).

Figure 10:
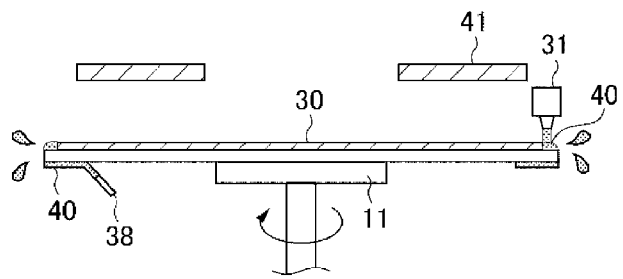
FIG. 10 is a process diagram illustrating the coating processing upon the wafer.
Figure 11:
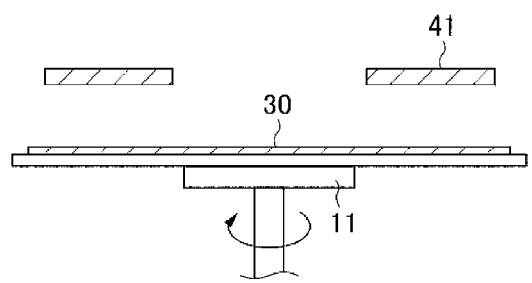
FIG. 11 is a process diagram illustrating the coating processing upon the wafer.

Thereafter, a supply of a solvent 40 onto the peripheral portion of the wafer W from the solvent supply nozzle 31 and a supply of the solvent 40 onto the rear surface of the wafer W from the rear surface cleaning nozzle 19 are performed, so that the unnecessary resist film 30 on the peripheral portion of the wafer W is removed, and the rear surface of the wafer W is cleaned (FIG. 10). Thereafter, the supply of the solvent 40 from the solvent supply nozzle 31 and the rear surface cleaning nozzle 19 is stopped and the rotation of the wafer W is stopped (time t5), and the processing upon the wafer W in the resist film forming apparatus 1 is ended (FIG. 11).

According to the resist film forming apparatus 1, after the wafer W is rotated at the relatively small rotation number in the state that the ring plate 41 is placed at the lowered position, the rotation number is increased. Accordingly, the resist film 30 is formed as the resist is rapidly dried, so that the throughput can be improved. Further, the resist film 30 can be formed such that the uniformity of the film thickness at individual positions within the surface of the wafer W is improved. To improve uniformity in an amount of the resist within the surface of the wafer W, the rotation number (first rotation number) of the wafer W within a time period from the time t2 to the time t4 is set to be, e.g., 10 rpm to 500 rpm, and, desirably, 10 rpm to 200 rpm. Further, the rotation number (second rotation number) of the wafer W after the time t4 needs to be set to allow the resist to be scattered off the peripheral portion of the wafer W. For example, the second rotation number is set to be equal to or higher than 1000 rpm. Moreover, the rotation number (third rotation number) in a time period from the time t1 to the time t2 for allowing the resist to be diffused to the peripheral portion of the wafer W is set to be larger than the rotation number in the time period from the time t2 to the time t4. The time period from the time t2 to the time t4 is, e.g., 10 sec to 300 sec, and, more specifically, e.g., 60 sec. The time period from the time t4 to the time t5 is, e.g., 3 sec to 30 sec, and, more specifically, e.g., 20 sec.

Further, the rotation number may be reduced after increased at the time t4, and the supply of the solvent from the solvent supply nozzle 31 and the rear surface cleaning nozzle 19 may be performed at the reduced rotation number. To elaborate, the rotation number appropriate for scattering the resist is set to be higher than the rotation number adequate for removing the resist film of the peripheral portion of the wafer W and cleaning the rear surface of the peripheral portion of the wafer W. In such a case, the resist can be scattered at the appropriate rotation number, and, then, the processing by the solvent can be carried out at the adequate rotation number. Although the ring plate 41 is moved to the lowered position at the time t3 after the rotation number is reduced at the time t2 to suppress the disturbance in the air flow on the front surface of the wafer W securely, the ring plate 41 may be moved to the lowered position at the time t2. Furthermore, though the changing of the rotation number and the moving of the ring plate 41 are begun at the time t4 in the above-described processing, the moving of the ring plate 41 may be begun prior to the time t4 after the time t3, and the rotation number may be changed after the moving of the ring plate 41 is begun.

The ring plate 41 is configured to be moved in the transversal direction between the outside of the cup 14 and the space above the wafer W. The ring plate 41 may be located above the wafer W in the aforementioned time period from the time t3 to the time t4, and placed at the outside of the cup 14 in the other time periods. In this case, the outside of the cup 14 is a first position, and the space above the wafer W is a second position, the same as in the above-described exemplary embodiment. Moreover, when the rotation number of the wafer W is increased to scatter the resist, the ring plate 41 is moved to be located at the outside of the cup 14. That is, the ring plate 41 is retreated from above the wafer W. Further, a distance between the wafer W and the ring plate 41 may be adjusted by moving the cup 14, the spin chuck 11 and the rotating device 12 up and down instead of moving the ring plate 41 up and down. That is, the ring plate 41 only needs to be moved between a position (covering position) where it covers the wafer W and a position other than the covering position when the wafer W is rotated at the relatively low rotation number in the time period from the time t2 to the time t4. The covering position is a position where the velocity of the air flow on the front surface of the wafer W becomes higher than a velocity of the air flow that can be obtained when the ring plate 41 is placed at the position other than the covering position.

In addition, in the above-described example, the bottom surface of the ring plate 41 is a horizontal plane. However, without being limited to the horizontal plane, the bottom surface of the ring plate 41 may be configured as an inclined plane. That is, the height of the first gap G of FIG. 1 may be different at respective positions on the bottom surface of the ring plate 41. For example, the height of the gap G may be in a range from 1 mm to 20 mm. Further, the exemplary embodiment is not limited to controlling the air flow by placing the circular ring-shaped member such as the ring plate 41 on the wafer W as the covering member. By way of example, a plate-shaped covering member may be disposed to face the bottom surface of the wafer W, and this plate-shaped covering member may be provided with a multiple number of holes opened at a region of the covering member corresponding to the central portion of the wafer W. The air supplied from the FFU 19 is supplied onto the front surface of the wafer W in a shower shape through these holes.

Figure 12:
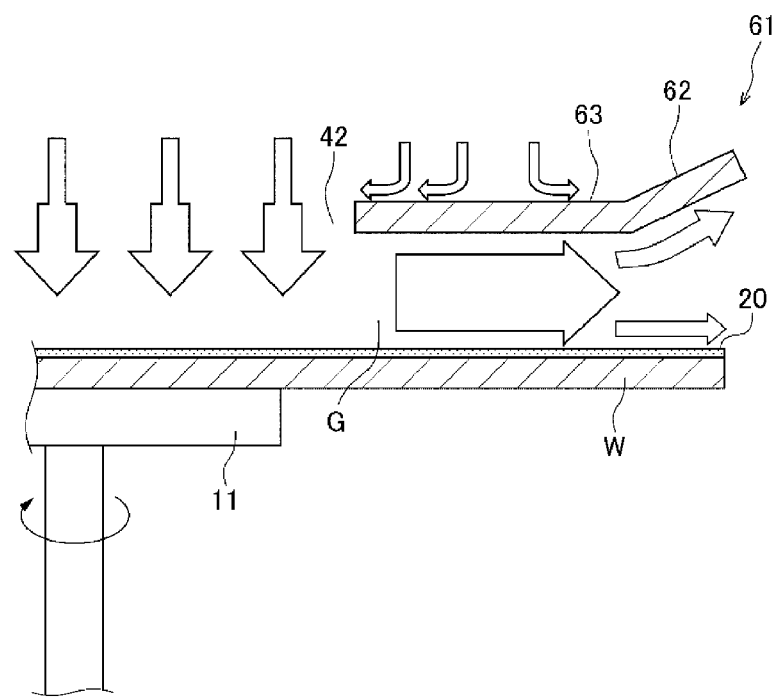
FIG. 12 is a longitudinal side view illustrating a modification example of a ring plate provided in the resist coating apparatus.

To slow down the drying of the resist at the peripheral portion of the wafer W as compared to the drying of the resist at an inner side than the peripheral portion, the ring plate is not limited to the above-described example, and a ring plate 61 as illustrated in FIG. 12 may be provided. For the ring plate 61, only distinctive features from the ring plate 41 will be explained. A peripheral portion of the ring plate 61 is bent from a central portion thereof. The peripheral portion of the ring plate 61 forms a first portion 62 facing the peripheral portion of the wafer W, and a bottom surface of this peripheral portion is formed as an inclined surface ascending toward an edge thereof. The central portion of the ring plate 61 forms a second portion 63 facing the middle portion of the wafer W, and a bottom surface of this central portion is formed as a horizontal plane, facing the middle portion of the wafer W. Since the ring plate 61 is formed as stated, the gap G is enlarged at the peripheral portion of the wafer W as it goes toward the edge of the wafer W. Since the flow velocity of the air flow flowing toward the peripheral portion of the wafer W increases with the decrease of the height of the gap G as stated above, the flow velocity of the air at the peripheral portion of the wafer W is lower than the flow velocity of the air at the central portion thereof. Therefore, the drying of the resist 20 at the peripheral portion of the wafer W can be suppressed.

Figure 13:
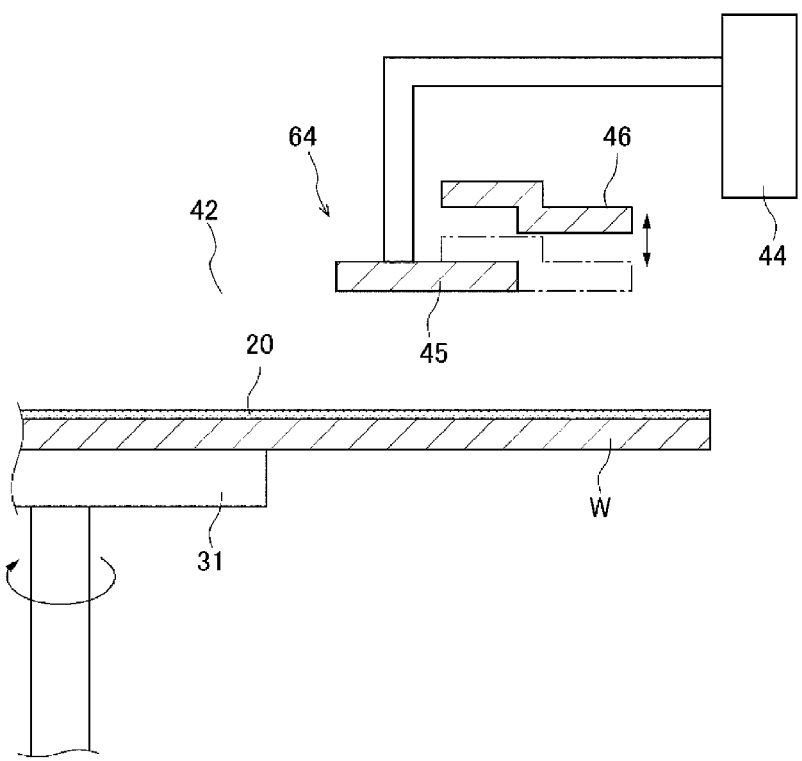
FIG. 13 is a longitudinal side view illustrating a modification example of the ring plate provided in the resist coating apparatus.

In addition, FIG. 13 illustrates a ring plate 64 as another configuration example of the ring plate of the present disclosure. Regarding the ring plate 64, only distinctive features from the ring plate 41 will be described. The ring plate 64 is equipped with a main body 45 as a circular ring-shaped plate having an opening 42 and configured to be moved up and down by the elevating device 44. An adaptor 46, which is a circular ring-shaped plate, is configured to be attached to the main body 35 in a detachable manner. An outer diameter of the adaptor is larger than an outer diameter of the main body 45, and the adaptor 46 is mounted to a peripheral portion of the main body 45. Accordingly, covered regions of the peripheral portion of the wafer W differs between two cases when the adaptor 46 is mounted and is not. That is, the adaptor 46 is a member for adjusting a width of an exposed region of the peripheral portion of the wafer W. In the drawing, a dashed dotted line indicates the adaptor 46 mounted to the main body 45, and a solid line indicates the adaptor 46 separated from the main body 45.

The adaptor 46 may be used for the purpose of removing a difference in drying property of the resist between apparatuses, and, also, used to deal with a case where the drying of the resist is difficult to control by adjusting a processing recipe such as the rotation number when the operation of the apparatus is begun, for example. Further, the adaptor 46 may be configured to be movable up and down by an elevating device, the same as the main body 45. Further, when the adaptor 46 is used, it may be moved to a position (indicated by the dashed dotted line in the drawing) where it is mounted to the main body 45, whereas when the adaptor 46 is not used, it may be moved to a position (indicated by the solid line in the drawing) upwardly distanced apart from the main body 45. That is, an operator may attach/detach the adaptor 46 to/from the main body 45, or an attaching/detaching device configured to attach/detach the adaptor 46 to/from the main body 45, which is the same as the aforementioned elevating device for the adaptor 46, may be provided.

In the above-described example, the resist is used as a coating liquid. However, the technique of the present disclosure is still applicable to a case where a coating liquid for forming another coating film, such as a chemical liquid for forming an antireflection film and a chemical liquid for forming an insulating film is used. Further, it should be noted that the above-described exemplary embodiments are illustrative in all aspects and are not anyway limiting. The above-described exemplary embodiments may be omitted, replaced and modified in various ways without departing from the scope and the spirit of claims.

(Evaluation Tests)

Hereinafter, evaluation tests conducted to investigate the present disclosure will the described.

[Evaluation Test 1]

As an evaluation test 1 (1-1 to 1-4), after the resist is coated on a plurality of wafers W by using the above-described resist film forming apparatus 1, the resist is dried under different conditions. Then, the thickness of the resist film at each position on a diameter of each wafer W is measured. As the evaluation test 1-1, after the resist is diffused to the peripheral portion of the wafer W as in the above-described exemplary embodiment, the resist is dried by setting the rotation number of the wafer W to 1000 rpm and locating the ring plate at the raised position. In the evaluation test 1-2, although the rotation number of the wafer W is set to be 1000 rpm as in the evaluation test 1-1, the aforementioned gap G is formed by placing the ring plate 41 at the lowered position and the drying of the wafer is performed in this state. The evaluation test 1-3 is performed in the same way as the evaluation test 1-1 except that the rotation number of the wafer W is set to be 100 rpm. The evaluation test 1-4 is performed in the same way as the evaluation test 1-2 except that the rotation number of the wafer W is set to be 100 rpm. Further, the ring plate used in individual evaluation tests including the evaluation test 1 is configured to cover the peripheral portion of the wafer W as well, unlike the above-described ring plate 41.

Figure 14:
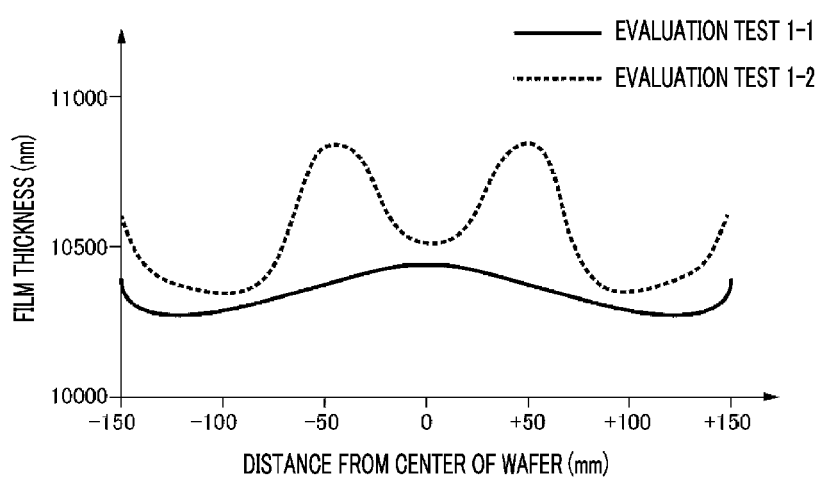
FIG. 14 is a graph showing results of evaluation tests.
Figure 15:
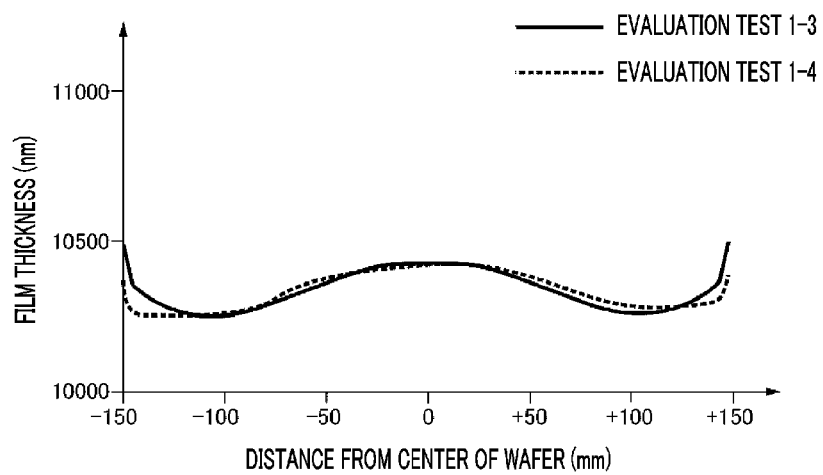
FIG. 15 is a graph showing results of evaluation tests.

FIG. 14 and FIG. 15 present graphs showing results of the evaluation test 1. A vertical axis of each graph represents a measured film thickness (unit: nm) of the resist, and a horizontal axis indicates a distance (mm) from the center of the wafer W. Regarding the distance from the center of the wafer W, a distance at one side is represented by a plus (+) value, and a distance at the other side is represented by a minus (−) value. FIG. 14 shows a result of the evaluation test 1-1 as a solid-lined graph and a result of the evaluation test 1-2 as a dotted-lined graph. FIG. 15 shows a result of the evaluation test 1-3 as a solid-lined graph and a result of the evaluation test 1-4 as a dotted-lined graph.

In comparison with the results of the evaluation tests 1-1 and 1-2 from FIG. 14, when the wafer W is rotated at 1000 rpm, the uniformity of the film thickness is found to be deteriorated when the relatively small gap G is formed on the wafer W by the ring plate 41, as compared to the case where the gap G is not formed. If a range from a maximum value to a minimum value of the film thickness is set as a film thickness range, the film thickness range when the gap G is formed is found to be approximately twice as large as the film thickness range when the gap G is not formed.

In comparison of the results of the evaluation tests 1-3 and 1-4, when the wafer W is rotated at 100 rpm, the film thickness is found not to be largely different between the two cases where the gap G is formed and is not, regarding the uniformity of the film thickness on the wafer W. The film thickness range is slightly smaller when the gap G is formed. Thus, it is proved from the evaluation test 1 that the uniformity of the film thickness of the resist film within the surface of the wafer W can be improved by rotating the wafer W at the relatively small rotation number in performing the drying of the resist in the state that the gap G is formed by the ring plate 41.

[Evaluation Test 2]

As an evaluation test 2-1, ethyl lactate, which is a liquid, is coated on the front surface of the wafer W, and by rotating the wafer W at 100 rpm using the resist film forming apparatus 1, the ethyl lactate is volatilized. In this rotation, the gap G is formed by the ring plate. Then, a volatilization rate of the ethyl lactate is measured at each position on the wafer W in the diametrical direction thereof. An evaluation test 2-2 is performed in the same way as the evaluation test 2-1 except that a resist coating apparatus without having the ring plate is used. Thus, in the evaluation test 2-2, the aforementioned relatively small gap G is not formed.

Figure 16:
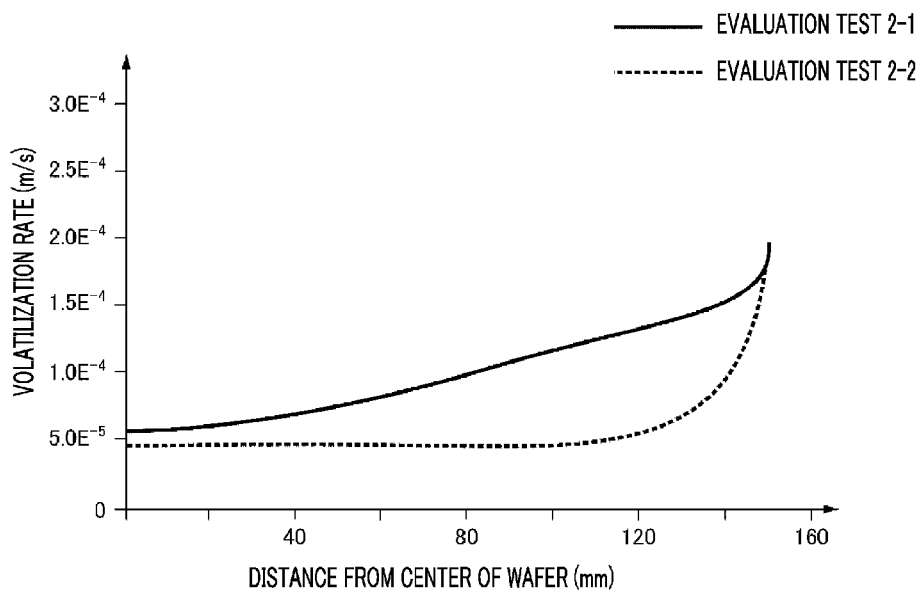
FIG. 16 is a graph showing results of evaluation tests.

FIG. 16 presents a graph showing a result of the evaluation test 2. A vertical axis of the graph represents a volatilization rate (unit: m/s) of the ethyl lactate, and a horizontal axis indicates a distance (unit: mm) from the center of the wafer W. In FIG. 16, a result of the evaluation test 2-1 is indicated by a solid line, and a result of the evaluation test 2-2 is indicated by a dotted line. It is found out from the evaluation tests 2-1 and 2-2 that the volatilization rate at the peripheral portion of the wafer W is larger than the volatilization velocity at the central portion of the wafer W in both cases where the ring plate is provided and is not.

[Evaluation Test 3]

Now, an evaluation test 3 will be described. As an evaluation test 3-1, the resist is coated on the wafer W by the resist film forming apparatus 1, and dried by rotating the wafer W at 100 rpm for a predetermined time. Then, a film thickness distribution in the diametrical direction of the wafer W is measured. In this evaluation test 3-1, when the resist is dried, the aforementioned gap G is formed by the ring plate. An evaluation test 3-2 is identical to the evaluation test 3-1 except that a ring plate having a shape different from the shape of the ring plate used in the evaluation test 3-1 is employed.

Figure 17:
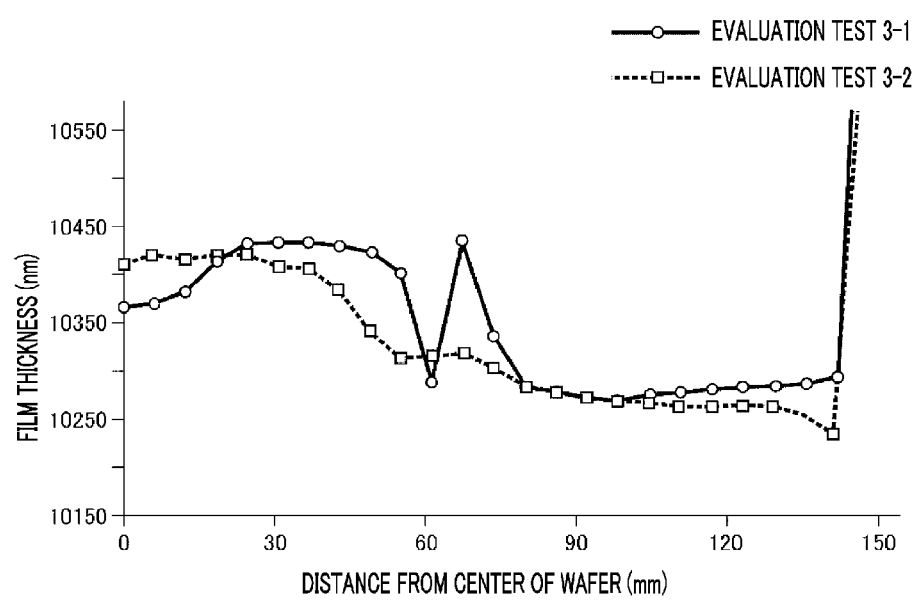
FIG. 17 is a graph showing results of evaluation tests.

FIG. 17 is a graph showing a result of the evaluation test 3. Like FIG. 14 and FIG. 15 of the evaluation test 1, FIG. 17 shows a relationship between the film thickness and the distance from the center of the wafer W. In FIG. 17, a circular plot indicates a result of the evaluation test 3-1, and a rectangular plot indicates a result of the evaluation test 3-2. It is found out from the graph of FIG. 17 that the film thickness at the peripheral portion of the wafer W is relatively large. Further, it is found out from the result of the evaluation test 3 and the result of the evaluation test 2 that there is a correlation between the distribution of the volatilization rate of the ethyl lactate and the distribution of the film thickness of the resist film. Thus, it is expected that the increase of the film thickness at the peripheral portion of the wafer W can be more securely suppressed by forming the ring plate as in the above-described various examples while suppressing the drying of the resist film at the peripheral portion of the wafer W.

According to the exemplary embodiments, it is possible to provide the technique capable of rapidly forming the coating film having the highly uniform film thickness within the surface of the substrate.

I claim:

1. A coating film forming method, comprising:
holding a substrate by a substrate holder;
forming an air flow on a front surface of the substrate by exhausting an atmosphere around the substrate;
supplying a coating liquid configured to form a coating film on the front surface of the substrate;
forming, after moving a covering member configured to cover the substrate from a first position to a second position relative to the substrate on which the coating liquid is supplied, the air flow in a gap formed by the covering member placed at the second position and the front surface of the substrate being rotated at a first rotation number such that a flow velocity of the air flow becomes larger than a flow velocity of the air flow obtained when the covering member is placed at the first position; and
rotating the substrate at a second rotation number higher than the first rotation number to adjust a film thickness distribution of the coating film by throwing the coating liquid off from a peripheral portion of the substrate,
wherein the covering member is an annular member formed along a circumference of the substrate,
the annular member includes an annular first portion whose circumferential edge is located at a position closer to a central portion of the substrate than a circumferential edge of the substrate or is located to face the peripheral portion of the substrate; and an annular second portion facing a region of the substrate inwardly positioned from the peripheral portion, and
a height from the substrate to the first portion is larger than a height from the substrate to the second portion.

2. The coating film forming method of claim 1,
wherein the forming of the air flow in the gap comprises forming the air flow such that drying of the coating film is slower at the peripheral portion of the substrate than at a portion of the substrate more centrally located than at the peripheral portion.

3. The coating film forming method of claim 1,
wherein the supplying of the coating liquid comprises rotating the substrate at a third rotation number larger than the first rotation number to diffuse the coating liquid supplied on a central portion of the substrate toward the peripheral portion thereof.

4. The coating film forming method of claim 1,
wherein the rotating of the substrate at the second rotation number is performed in a state that a gap formed between the front surface of the substrate and the covering member is larger than the gap in the forming of the air flow in the gap or in a state that the covering member is retreated from above the substrate.

5. The coating film forming method of claim 1,
wherein the first rotation number is in a range from 10 rpm to 500 rpm.

6. The coating film forming method of claim 1,
wherein the second rotation number is equal to or larger than 1000 rpm.

7. The coating film forming method of claim 1,
wherein the substrate on which the coating liquid is supplied has an irregularity pattern formed on the front surface thereof.

8. A coating film forming method, comprising:
holding a substrate by a substrate holder;
forming an air flow on a front surface of the substrate by exhausting an atmosphere around the substrate;
supplying a coating liquid configured to form a coating film on the front surface of the substrate;
forming, after moving a covering member configured to cover the substrate from a first position to a second position relative to the substrate on which the coating liquid is supplied, the air flow in a gap formed by the covering member placed at the second position and the front surface of the substrate being rotated at a first rotation number such that a flow velocity of the air flow becomes larger than a flow velocity of the air flow obtained when the covering member is placed at the first position; and
rotating the substrate at a second rotation number higher than the first rotation number to adjust a film thickness distribution of the coating film by throwing the coating liquid off from a peripheral portion of the substrate,
wherein a diameter of an outer circumference of the covering member is smaller than a diameter of the substrate such that the covering member does not cover a peripheral edge of the substrate.

9. The coating film forming method of claim 8,
wherein an opening is formed at a central portion of the covering member, and
a diameter of the opening is in a range from 30 mm to 80 mm.

10. The coating film forming method of claim 8,
wherein the forming of the air flow in the gap comprises forming the air flow such that drying of the coating film is slower at the peripheral portion of the substrate than at a portion of the substrate more centrally located than at the peripheral portion.

11. The coating film forming method of claim 8,
wherein the supplying of the coating liquid comprises rotating the substrate at a third rotation number larger than the first rotation number to diffuse the coating liquid supplied on a central portion of the substrate toward the peripheral portion thereof.

12. The coating film forming method of claim 8, wherein the rotating of the substrate at the second rotation number is performed in a state that a gap formed between the front surface of the substrate and the covering member is larger than the gap in the forming of the air flow in the gap or in a state that the covering member is retreated from above the substrate.

* * * * *